(12) United States Patent
Leussler et al.

(10) Patent No.: US 10,509,085 B2
(45) Date of Patent: Dec. 17, 2019

(54) AUTOMATED IMPEDANCE ADJUSTMENT OF A MULTICHANNEL RF COIL ASSEMBLY

(71) Applicant: KONINKLIJKE PHILIPS N.V., Eindhoven (NL)

(72) Inventors: Christoph Leussler, Eindhoven (NL); Peter Vernickel, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 164 days.

(21) Appl. No.: 15/542,966

(22) PCT Filed: Jan. 6, 2016

(86) PCT No.: PCT/EP2016/050095
§ 371 (c)(1),
(2) Date: Jul. 12, 2017

(87) PCT Pub. No.: WO2016/116287
PCT Pub. Date: Jul. 28, 2016

(65) Prior Publication Data
US 2017/0371012 A1    Dec. 28, 2017

(30) Foreign Application Priority Data
Jan. 21, 2015  (EP) ..................... 15151955

(51) Int. Cl.
*G01R 33/36* (2006.01)
*G01R 33/565* (2006.01)
(Continued)

(52) U.S. Cl.
CPC ....... *G01R 33/3628* (2013.01); *G01R 33/283* (2013.01); *G01R 33/3614* (2013.01);
(Continued)

(58) Field of Classification Search
None
See application file for complete search history.

(56) References Cited

U.S. PATENT DOCUMENTS

| | | | |
|---|---|---|---|
| 7,701,211 B2 | 4/2010 | Katscher et al. | |
| 8,981,774 B2 * | 3/2015 | Leussler | G01R 33/3628 324/307 |

(Continued)

FOREIGN PATENT DOCUMENTS

| | | |
|---|---|---|
| WO | 2011033400 A1 | 3/2011 |
| WO | 2013008116 A1 | 1/2013 |
| WO | 2014096997 A1 | 6/2014 |

*Primary Examiner* — Paresh Patel

(57) ABSTRACT

A multichannel radio frequency (RF) receive/transmit system (200) for use in an magnetic resonance (MR) imaging system (110) includes an RF coil array (202) with multiple RF coil elements (204) for emission and reception of RF signals. Each RF coil element (204) is provided with a tuning/matching circuit (208) for comparing forward power provided to at least one of the RF coil elements (204) with reflected power at the respective RF coil element (204) of the at least one of the RF coil elements (204), and for tuning the at least one of the RF coil elements (204) based on a comparison of the forward power and the reflected power at least one of the RF coil elements (204). A magnetic resonance (MR) imaging system (110) which includes the multichannel RF receive/transmit system (200) performs magnetic resonance (MR) imaging.

18 Claims, 8 Drawing Sheets

(51) Int. Cl.
*G01R 33/28* (2006.01)
*G01R 33/3415* (2006.01)

(52) U.S. Cl.
CPC ... *G01R 33/5659* (2013.01); *G01R 33/56509* (2013.01); *G01R 33/3415* (2013.01)

(56) References Cited

U.S. PATENT DOCUMENTS

| | | |
|---|---|---|
| 2003/0016015 A1 | 1/2003 | Eggers et al. |
| 2012/0032678 A1 | 2/2012 | Vaughan et al. |
| 2012/0152951 A1 | 6/2012 | Gonzalez |
| 2012/0169335 A1 | 7/2012 | Leussler |
| 2012/0223709 A1 | 9/2012 | Schillak et al. |
| 2013/0285659 A1 | 10/2013 | Sohn et al. |
| 2014/0225613 A1 | 8/2014 | Reykowski |

\* cited by examiner

AUTOMATED IMPEDANCE ADJUSTMENT OF A MULTICHANNEL RF COIL ASSEMBLY

CROSS REFERENCE TO RELATED APPLICATIONS

This application is a U.S. national phase application of International Application No. PCT/EP2016/050095, filed on Jan. 6, 2016, which claims the benefit of EP Application Serial No. 15151955.0 filed on Jan. 21, 2015 and is incorporated herein by reference.

FIELD OF THE INVENTION

The invention relates to the field of magnetic resonance (MR) imaging. In particular, the present invention relates to the field of radio frequency (RF) coils for use in MRI systems, in particular to the field of multi-element RF coil arrays for use in MRI systems having multiple RF coil elements. Still further, the invention relates to the field of matching, tuning and/or decoupling of RF coils and/or RF coil elements.

BACKGROUND OF THE INVENTION

Magnetic resonance (MR) imaging systems are often used for the examination of patients, further referred to in general as subject of interest. In terms of imaging, the subject of interest is also referred to as a load. By such a system, the nuclear spins of the body tissue to be examined are aligned by a static main magnetic field $B_0$ and are excited by transverse magnetic fields $B_1$ oscillating in the radio frequency band. In MR imaging, relaxation signals are exposed to gradient magnetic fields to localize the resultant resonance. The relaxation signals are received and reconstructed into a single or multi-dimensional image. Furthermore, in MR spectroscopy systems, information about the composition of the tissue, which is carried in the frequency component of the resonance signals, is further evaluated to obtain additional information.

Typically, a radio frequency (RF) coil system is provided for transmission of RF signals and for reception of resonance signals from the subject of interest. The RF coil system may comprise a single RF coil element, e.g. a body coil, which may be integral part of the MR imaging system. In addition or alternatively, the RF coil system may comprise special purpose coils, which can e.g. be flexibly arranged around the subject of interest or in a specific region of the subject of interest to be examined. Special purpose coils are designed to optimize signal-to-noise ratio (SNR), particularly in situations where homogeneous excitation and high sensitivity detection is required. Furthermore, special sequences of RF signals, increased field strengths, high flip angles or real-time sequences can be realized and generated using multi-element coil arrays, which comprise multiple independent RF coil elements, which provide the possibility for multi-channel transmission and/or reception of RF signals.

In state of the Art MR imaging systems, the use of RF coil systems with multi-element RF coil arrays is becoming more and more common. The use of such RF coil systems can improve $B_1$ magnetic field homogeneity and reduce specific absorption rate (SAR) in subjects of interest, which permits operation at high field strengths, e.g. 3 Tesla (T) or even higher.

Today, the clinical application of multi channel transmission is RF-shimming at 3 T, since wave propagation effects generate big variations in many subjects of interest. RF shimming is needed to improve the homogeneity of the transmit field amplitude and enables clinical investigation with even with wave propagation effects present within the volume of interest of the subject of interest. Basic idea of RF-shimming is to superimpose various transmit fields with different shapes, phase and amplitude so that the sum of the individual transmit field amplitudes becomes homogeneous inside a desired FOV covering the subject of interest and additionally obtain a optimization for reduced total and local absorbed RF energy (SAR specific absorption rate) in the human subject.

Those transmit fields are typically generated by a multi-element RF coil array. One of the challenges in the development of such a RF coil arrays is to improve the power efficiency. Due to different position and loading, efficient individual RF power matching is required. A further clinical application is the use of individual transmit pulses for MR imaging (Transmit Sense). These pulses differ in envelope, phase, amplitude, frequency and time.

US-patent application US2013/0285659 (Sohn) discloses an RF coil assembly and discusses sampling of RF power from the RF signal path and employs the ratio of forward and reflected power to control the tuning and matching.

SUMMARY OF THE INVENTION

It is an object of the invention to provide a multichannel radio frequency (RF) receive/transmit system for use in an magnetic resonance (MR) imaging system, comprising a RF coil array with multiple RF coil elements, a MR imaging system comprising the multichannel RF receive/transmit system, and methods for performing MR imaging, which enable a simple and efficient tuning of RF coil elements, which facilitate shimming in MR imaging, which enable provisioning of a homogeneous magnetic field for MR imaging, and which enable an efficient workflow for MR imaging.

This object is achieved by a multichannel radio frequency (RF) receive/transmit system for use in an magnetic resonance (MR) imaging system, comprising a RF coil array with multiple RF coil elements for emission and reception of RF signals, whereby each RF coil element is provided with tuning means, and a tuning/matching circuit for comparing forward power provided to at least one of the RF coil elements with reflected power at the respective RF coil element of the at least one of the RF coil elements, and for tuning the at least one of the RF coil elements based on a comparison of the forward power and the reflected power at least one of the RF coil elements.

This object is further achieved by a magnetic resonance (MR) imaging system comprising the above multichannel RF receive/transmit system.

This object is still further achieved by different methods for performing magnetic resonance (MR) imaging using the above MR imaging system.

The invention allows tuning and matching of the RF coil elements to adjust the RF shimming settings of the RF coil array in dependence of the load of the RF coil array so as to generate a spatially uniform B1 field. This can be performed without the need to employ a main control functionality in a host computer of the magnetic resonance imaging system. Accordingly, the MR imaging system does not need to be occupied for performing the tuning and for determining the RF shimming parameters. The tuning and matching process also provides a defined load for a RF power amplifier employed in the MR imaging system and thus best matching from the RF power amplifier to the load, thereby reducing requirements regarding maximal RF power output and thus reducing costs. Hence, when tuning is mentioned in the present application, this includes tuning and matching. With the proposed hardware, a corresponding workflow featuring an automated adjustment of the RF coil elements to current loading conditions can be achieved in an almost system independent manner. Accordingly, a tuned multichannel RF receive/transmit system can be transferred between different MR imaging systems without the need for tuning by the MR imaging system.

According to the invention, different imaging tasks for different patients having different physical conditions, including height, weight, and age, can be reliably performed. Furthermore, imaging task which are affected by motion of the patient, either a desired motion, or an undesired motion, can be performed with high reliability, since the RF shimming parameters can be easily adapted to changing load conditions. Motion of the patient includes breathing movement. Hence, compromises in design of RF coil elements and RF coil array, focusing on the average patient and an average MR imaging application, are can be overcome. Also influences of the RF screen on the load condition of the RF coil array may be overcome. When individual RF coil elements are located close by the RF screen of the MR imaging system, the load condition of the RF coil array may be changed, even without movement of the subject of interest. This is typically the case for subjects of interest having an increased circumference.

One advantage is an efficient usage of RF power when patient or imaging region deviates from the average. Furthermore, the verification of the current tuning status by comparison of forward and reflected power and the adaptation of the tuning involves the whole system architecture, which increases the effect of tuning. Also an integrated multichannel RF receive/transmit system can be provided, which reduces hardware costs thereof. The required interaction with the system can be minimized reducing effort for control and cables and improving the workflow for MR imaging.

The tuning of the RF coil elements is preferably performed prior to starting a MR imaging method for generation of a MR image. Nevertheless, the method can also be performed during the measurement to continuously monitor the load and to continuously adapt the RF coil element to current load conditions. Load refers to the subject of interest influencing the generated magnetic field.

The RF coil array is typically a transmit and receive coil array. Nevertheless, in some cases, the RF coil array can be provided for transmit or receive only. The RF coil system comprises at least one RF coil element. Typically, RF coil arrays are provided with up to 16 or 32 individual coil elements. When operated in the MR imaging system, the RF coil array may be operated with a reduced number of channels compared to the number of RF coil elements when being used for transmit. For receive, the RF coil array is typically operated to receive individual signals from all RF coil elements. The RF coil array can be provided e.g. as a body coil, which may be integrally connected to the MR imaging system. In addition or alternatively, the multichannel RF receive/transmit system with the RF coil array is provide as a special purpose coil, which can e.g. be flexibly arranged around the subject of interest or in a specific region of the subject of interest to be examined. Hence, the RF coil array can be a planar array of coil elements.

Tuning means can comprise any means for changing the resonance frequency of the respective RF coil element, e.g. tunable capacitors.

Preferably, the tuning/matching circuit comprises e.g. a directional coupler (DIRC) for providing the forward and reflected power for each RF coil element via an A/D converter to a control logic, also referred to as controller. The directional coupler is preferably located close to the respective RF coil element. The controller steers all components for measuring the coil parameters and for performing the tuning of the RF coil elements. In particular, the controller can provided a N×N RF coil element parameter matrix, whereby N is the number of RF coil elements. Along the diagonal of the matrix, element matching is provided, whereas out off the diagonal, element coupling of the different RF coil elements can be seen. For performing the tuning, a tune actuator is preferably provided. The tune actuator is a driver for realizing the adjustment set of the tuning means. Depending on the tuning means, the tune actuator provides a current or a voltage to the tuning means. Still further preferred, the tuning/matching circuit comprises at least on transmit/receive switch (TR switch). This TR switch is a standard component of transmit coil arrays enabling the use of the RF coil array also for reception, when switching between a transmit and receive path of the MR imaging system.

According to a preferred embodiment the multichannel RF receive/transmit system additionally comprises at least one RF amplifier for driving the RF coil array, and the tuning/matching circuit comprises RF signal generating means for providing a RF signal to the at least one RF amplifier. Accordingly, an integral design of the RF coil system multichannel RF receive/transmit system can be provided, where the tuning of the RF coil elements can be achieved autonomously without the need for external feeding. Hence, the multichannel RF receive/transmit system can be provided as an autonomous system, which performs tuning of the RF coil elements on its own. The at least one amplifier can refer to at least one separate RF amplifier for the tuning/matching circuit, which can be provided as a small amplifier, since comparison of forward power and the reflected power does not require application of high power, which makes the hardware design simple and small. Alternatively, the at least one RF amplifier can be the at least one RF amplifier for driving the RF coil array in normal operation, so that no additional amplifier is required, and the design of the multichannel RF receive/transmit system can be kept simple with few components. The RF signal generating means preferably comprise a RF oscillator, which generates a low power RF signal with less than 0 dB at the intended resonance frequency of the RF coil element. Accordingly, the RF signal generating means can be provided as a relatively simple RF source with a constant output level. The RF signal generating means can also comprise a pulsed RF source, so that the RF source produces less local heat when provided locally with the tuning/matching circuit. The RF signal from the RF signal generating means is coupled into the signal path for normal operation of the RF coil array. Further preferred, also a power combiner can be provided within the RF coil array to further enhance the integral design. To keep the multichannel RF receive/transmit system simple, a single RF amplifier can be provided together with a de-multiplexer to provide the RF signal via the amplifier to multiple RF coil elements. State of the Art RF coil arrays are provided with a continuously increased degree of integration, so that individual RF coil elements are sometimes not directly accessible from outside, so that tuning is not possible. With the proposed multichannel RF receive/transmit system, tuning of the individual RF coil elements can be realized even for RF coil arrays with a high degree of integration.

According to a preferred embodiment of the multichannel RF receive/transmit system the tuning/matching circuit comprises multiplexing means, which are connected to the RF coil elements for multiplexing the forward and reflected power of multiple RF coil elements. Accordingly, hardware requirements for the tuning/matching circuit can be reduced. The multiplexing means are connected at their input side to the RF coil elements, and at the output side to the controller. The tuning/matching circuit can compare the forward and reflected power of all RF coil elements sequentially. Accordingly, this hardware concept reduces the required number of measurement channels, which can be very high depending on the number of RF coil elements.

According to a preferred embodiment of the multichannel RF receive/transmit system the RF coil array is provided integrally with the tuning/matching circuit. Hence, tuning/matching and decoupling of the RF coil elements can be directly modified within the integral system. The required interaction with the MR imaging system can be minimized, which reduces effort for control and cabling. Furthermore, the tuning and matching process also provides a defined load for a RF power amplifier employed in the MR imaging system and thus best matching from the RF power amplifier to the load, thereby reducing requirements regarding maximal RF power output and thus reducing costs. State of the Art RF coil arrays are provided with a continuously increasing degree of integration, so that individual RF coil elements and/or other integrated components are sometimes not directly accessible from outside, and tuning is not possible. With the proposed multichannel RF receive/transmit system, tuning of the individual RF coil elements can be realized even for RF coil arrays with a high degree of integration.

According to a preferred embodiment of the multichannel RF receive/transmit system according the tuning/matching circuit comprises a look-up table with tuning settings depending on a load. The look-up table is preferably provided when designing the RF coil array with the RF coil elements under consideration of different loading conditions. Accordingly, when the load is determined for the RF coil array of the multichannel RF receive/transmit system, necessary tuning settings can be easily accessed from the look-up table and applied to the tuning means of the RF coil elements.

According to a preferred embodiment of the multichannel RF receive/transmit system the tuning/matching circuit comprises input means for receiving input in respect to the load. The input in respect to the load can comprise different information. In one embodiment, the information can contain motion information for processing together with the comparison of the forward and reflected power, e.g. for generating a kind of profile combining tuning and motion information. In particular, this can refer to breathing information, which is repetitive, so that different motion states occur repeatedly. Furthermore, the information can contain motion information for applying the tuning to the RF coil array. E.g. after an initial phase for evaluating tuning settings for different motion states, the tuning settings can be directly applied based on the motion information without prior comparison of forward and reflected power, which facilitates tuning of the RF coil array. The information can also comprise information in respect to the physical parameters, e.g. physical dimensions of the subject of interest, e.g. whether the subject of interest is big or small compared to an average subject of interest. Still further, the information can comprise information in respect to the location of the subject of interest, e.g. an absolute position within the bore, or a position of a patient support when the support is being moved within the bore during acquisition of MR imaging data. Also the position of the subject of interest may influence the load. Preferably, also a status of the MR imaging system is provided to the tuning/matching circuit via the input means. This enables a simple triggering for starting the tuning of the RF coil array depending on the operational status of the MR imaging system.

According to a preferred embodiment of the multichannel RF receive/transmit system comprises at least one marker for marking a position of the multichannel RF receive/transmit system, in particular for marking a position of the RF coil array. With the marker, the position of the subject of interest can be recognized based on the marker of the RF coil array, e.g. when the RF coil array is provided on top of the subject of interest. The RF coil array in this case moves together with the subject of interest, when the patient support is moved within the bore of the MR imaging system. The marker can be detected by monitoring means of the MR imaging system. The marker can be e.g. a visible marker, a groove, a projection, a label, or a radio marker which transmits a signal e.g. upon triggering.

According to a preferred embodiment the MR imaging system comprises monitoring means for detecting a movement of a load located within a bore of the MR imaging system, whereby the monitoring means are connected to the tuning/matching circuit of the multichannel RF receive/transmit system, and the monitoring means are adapted to provide movement information of the load to the tuning/matching circuit. The movement of the load may refer to breathing of the subject of interest, which implies respiratory movement of an upper part of the body of the subject of interest, a movement of the subject of interest as a whole, e.g. when the load is moved on a patient support within a bore of the MR imaging system during operation, or any other unrelated movement of the subject of interest, e.g. when the subject of interest moves an arm or a leg or turns its head. Hence, movement of the load comprises partial movement of the load. The movement can be monitored e.g. using breath detection means like a respiratory belt or monitoring a change of the reflected RF power of the individual RF coil elements. Furthermore, the movement of the load can be monitored by monitoring the load directly, or monitor e.g. the patient support. Still further, the multichannel RF receive/transmit system, in particular the RF coil array, can be provided with at least one marker, and the movement of the marker can be monitored to derive the movement of the subject of interest.

According to a preferred embodiment the MR imaging system the monitoring means for detecting a movement of a load located within a bore of the MR imaging system comprise at least one camera. The camera is used for visually monitoring the motion. Image processing is required to determine the motion of the subject of interest based on acquired images provided by the camera. Preferably, image processing is facilitating by monitoring the position of at least one marker provided at the RF coil array. Further preferred, the monitoring means comprise multiple cameras, which are located within the bore, e.g. in an essentially straight line. In alternative embodiments, the at least one camera can also be provided outside the bore.

The above object is in particular solved by a method for performing magnetic resonance (MR) imaging using the above MR imaging system, comprising the steps of tuning the RF coil array by providing forward power to at least one RF coil element of the RF coil array, comparing the forward power and the reflected power at the respective RF coil element of the at least one of the RF coil elements, and tuning the at least one of the RF coil elements based on a comparison of the forward power and the reflected power at least one of the RF coil elements, performing MR data acquisition, verifying if imaging quality is sufficient, and performing repeated tuning if imaging quality is not sufficient. The step of verifying if imaging quality is sufficient can comprise any kind of verification, if acquisition of MR signals are reliably acquired. In one embodiment, the step of verifying if imaging quality is sufficient comprises verifying a signal to noise ratio of the acquired MR imaging data. Upon indication from the verification step, additional tuning of the RF coil array is performed.

The above object is in particular solved by a method for performing magnetic resonance (MR) imaging using the above MR imaging system, comprising the steps of performing a pre-tuning step for evaluating tuning settings for the RF coil array based on different positions of the load within a bore of the MR imaging system and based on a comparison of forward power and reflected power of at least one of the RF coil elements of the RF coil array, starting a MR imaging sequence, monitoring movement of the load within the bore of the MR imaging system, and continuously performing tuning of the RF coil array under consideration of the movement of the load within the bore as monitored. This method refers to performing MR imaging in breathing condition, e.g. MR imaging of a chest of the subject of interest. Hence, since respiration continuously occurs and affect the tuning of the RF coil elements of the RF coil array, the tuning can be easily performed under consideration of the information gathered in the pre-tuning step. Accordingly, in the pre-tuning step, tuning settings for different breathing movement conditions are determined and stored, so that upon reception of breathing movement information, these setting can be easily applied from the stored settings without prior evaluation of the load.

According to a preferred embodiment the method for performing MR imaging comprises the steps of storing the evaluated tuning settings of the pre-tuning step with reference to a particular load, and loading the stored tuning settings of the pre-tuning step with reference to the particular load prior to starting a MR imaging sequence. Hence, the tuning settings can be re-utilized. It is merely required to perform a kind of adjustment in case the position of the subject of interest e.g. on the patient support has varied.

According to a preferred embodiment the method for performing magnetic resonance (MR) imaging comprises the steps of evaluating the size of the load, and performing a tuning of the RF coil array under consideration of the size of the load. The size of the load can be monitored e.g. using the camera, so that predefined tuning settings can be easily applied depending on the load size.

It is apparent for a person skilled in the Art that steps of the above methods, which have been described here as individual methods, can be combined amongst the described methods. Accordingly, tuning or pre-tuning is performed under consideration of different kinds of information, which may further increase the reliability of tuning and improve the workflow for MR imaging and the quality of images obtained by MR imaging.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
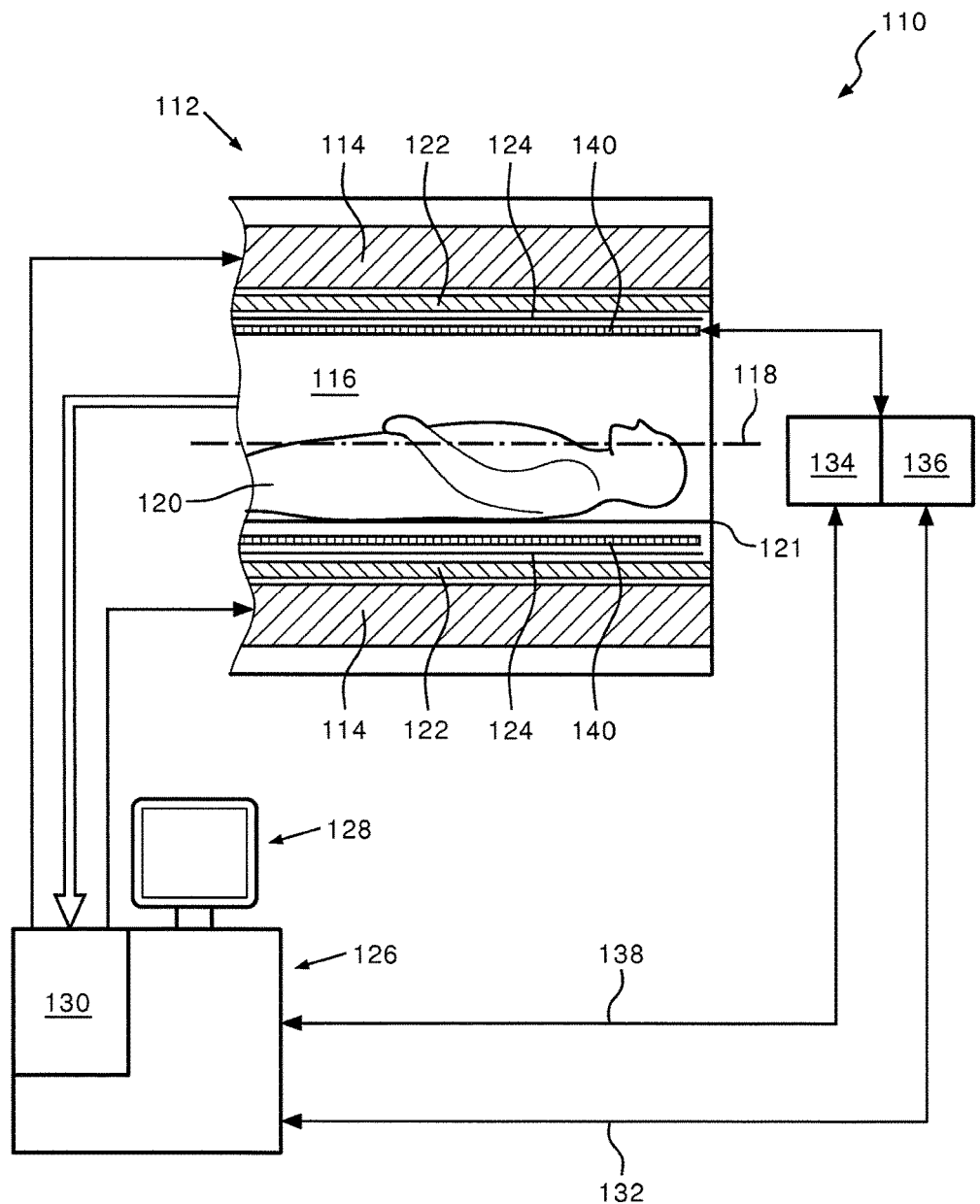
FIG. 1 is a schematic illustration of a part of a generic embodiment of a magnetic resonance (MR) imaging system.

FIG. 1 shows a schematic illustration of a part of a generic embodiment of a magnetic resonance (MR) imaging system 110 comprising an MR scanner 112. The MR imaging system 110 is described here generically as a basis for all further embodiments.

The MR imaging system 110 includes a main magnet 114 provided for generating a static magnetic field. The main magnet 114 has a central bore 116 that provides an examination space around a center axis 118 for a subject of interest 120, usually a patient, to be positioned within on a patient support 121. In this embodiment, the central bore and therefore the static magnetic field of the main magnet 114 have a horizontal orientation in accordance with the center axis 118. In an alternative embodiment, the orientation of the main magnet 114 can be different, e.g. to provide the static magnetic field with a vertical orientation. Further, the MR imaging system 110 comprises a magnetic gradient coil system 122 provided for generating gradient magnetic fields superimposed to the static magnetic field. The magnetic gradient coil system 122 is concentrically arranged within the bore of the main magnet 114, as known in the art.

Further, the MR imaging system 110 includes a radio frequency (RF) coil 140 designed as a whole-body coil having a tubular body. In an alternative embodiment, the RF coil 140 is designed as a head coil or any other suitable coil type for use in MR imaging systems 110. The RF coil 140 is provided for applying an RF magnetic field to the examination space 116 during RF transmit phases to excite nuclei of the subject of interest 120, which shall be covered by MR images. The RF coil 140 is also provided to receive MR signals from the excited nuclei during RF receive phases. In a state of operation of the MR imaging system 110, RF transmit phases and RF receive phases are taking place in a consecutive manner. The RF coil 140 is arranged concentrically within the bore of the main magnet 114. As is known in the art, a cylindrical metal RF screen 124 is arranged concentrically between the magnetic gradient coil system 122 and the RF coil 140.

In this context, it is to be noted that the RF coil 140 has been described as transmit and receive coil. Nevertheless, the RF coil 140 can also be provided as transmit or receive coil only. In some embodiments, the RF coil 140 can be omitted.

Moreover, the MR imaging system 110 comprises an MR image reconstruction unit 130 provided for reconstructing MR images from the acquired MR signals and an MR imaging system control unit 126 with a monitor unit 128 provided to control functions of the MR scanner 112, as is commonly known in the art. Control lines 132 are installed between the MR imaging system control unit 126 and an RF transmitter unit 134 that is provided to feed RF power of an MR radio frequency to the RF antenna device 140 via an RF switching unit 136 during the RF transmit phases. The RF switching unit 136 in turn is also controlled by the MR imaging system control unit 126, and another control line 138 is installed between the MR imaging system control unit 126 and the RF switching unit 136 to serve that purpose. During RF receive phase, the RF switching unit 136 directs the MR signals from the RF coil 140 to the MR image reconstruction unit 130 after pre-amplification.

Figure 2:
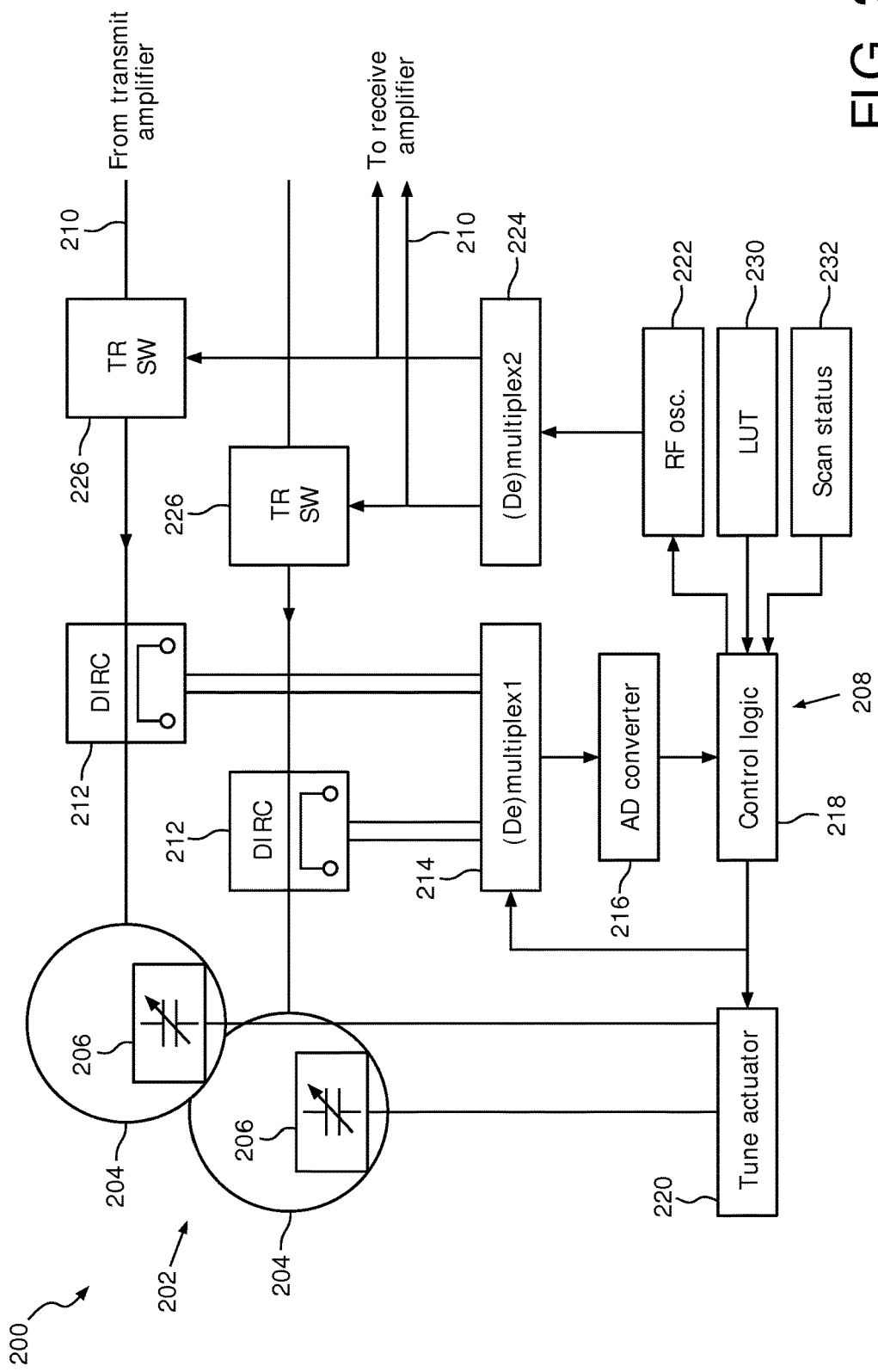
FIG. 2 is a schematic illustration of a multichannel radio frequency (RF) receive/transmit system according to a first embodiment.

FIG. 2 schematically illustrates a multichannel radio frequency (RF) receive/transmit system 200 for use in a MR imaging system 110 according to a first embodiment. The multichannel RF receive/transmit system 200 comprises a RF coil array 202 with multiple RF coil elements 204 for emission and reception of RF signals. Each RF coil element 204 is provided with tuning means 206 for tuning its resonance frequency. The tuning means 206 comprise in this embodiment tunable capacitors for changing the resonance frequency of the respective RF coil element 204. The RF coil array 202 is a transmit and receive coil array in this embodiment. The RF coil array 202 of the first embodiment is illustrated with only two coil elements 204, but has depending on the embodiment up to 16 or 32 individual RF coil elements.

The RF receive/transmit system 200 further comprises a tuning/matching circuit 208 for comparing forward power provided to at least one of the RF coil elements 204 with reflected power at the respective RF coil element 204 of the at least one of the RF coil elements 204, as will be discussed below in more detail. In this embodiment, the RF coil array 202 is provided integrally with the tuning/matching circuit 208.

The tuning/matching circuit 208 comprises a directional coupler (DIRC) 212 for determining the forward and reflected power for each RF coil element 204, which is located close to the respective RF coil element 204. The tuning/matching circuit 208 comprises a multiplexer 214 as multiplexing means, which are connected to the directional couplers 212 for the RF coil elements 204 for multiplexing the forward and reflected power of the RF coil elements 204. At its output side the multiplexer 214 is connected via an A/D converter 216 to a control logic 218, also referred to as controller. The controller 218 of the tuning/matching circuit 208 compares the forward and reflected power of all RF coil elements 204 sequentially, as provided from the directional couplers 212 via the multiplexer 214 and the A/D converter 216.

The controller 218 steers all components for measuring the coil parameters and for performing the tuning of the RF coil elements 204. In particular, the controller 218 is adapted to provide a N×N RF coil element parameter matrix, whereby N is the number of RF coil elements 204. Along the diagonal of the matrix, element matching is provided, whereas out off the diagonal, element coupling of the different RF coil elements 204 is provided.

The tuning/matching circuit 208 further comprises a tune actuator 220. The tune actuator 220 is a driver for realizing the adjustment set of the tuning means 206. Depending on the tuning means 206, the tune actuator 208 provides a current or a voltage to the tuning means 206. The controller 218 tunes the RF coil elements 204 based on a comparison of the forward power and the reflected power at the respective RF coil elements 204. In some embodiments, also RF power of other RF coil elements 204 is considered. The tuning of the RF coil elements 204 allows to adjust the RF shimming settings of the RF coil array 202 in dependence of the load 120 of the RF coil array 202 so as to generate a spatially uniform B1 field.

The tuning/matching circuit 208 further comprises RF signal generating means 222, which comprise an oscillator for providing a RF signal with less than 0 dB at the intended resonance frequency of the RF coil element 204 in this embodiment. The oscillator 222 can be provided integrally with a small RF amplifier. The RF signal generating means 222 are in this embodiment connected to a demultiplexer 224, which demultiplexes the RF signal to cables connecting the RF coil elements 204 with a MR imaging system control unit 126 of the MR imaging system 110. The cables 210 are connected via transmit/receive (TR) switches 226 to the RF coil elements 204. The TR switches 226 enable switching between a transmit and receive path of the MR imaging system 110. Furthermore, the multichannel RF receive/transmit system comprises a RF amplifier for driving the RF coil array 202 in normal operation, which is not shown in the figures, and which also amplifies the RF signal provided from the RF signal generating means 222.

Furthermore, also a power combiner, which is not shown in the figures, which combines at least some of the RF coil elements 204 to a single channel, is provided within the RF coil array 202.

The tuning/matching circuit 208 of the multichannel RF receive/transmit system 200 according to the first embodiment further comprises a look-up table (LUT) 230 with tuning settings depending on a load. The look-up table is provided when designing the RF coil array 202 with the RF coil elements 204 under consideration of different loading conditions. Accordingly, when the load is determined for the RF coil array 202 of the multichannel RF receive/transmit system 200, necessary tuning settings can be directly accessed from the look-up table 230 and applied to the tuning means 206 of the RF coil elements 204.

The tuning/matching circuit 208 of the multichannel RF receive/transmit system 200 according to the first embodiment further comprises input means 232 for receiving input in respect to the load. Hence, the information can be processed processing together with the comparison of the forward and reflected power for generating a profile combining tuning and motion information. Details are discussed below.

Figure 3:
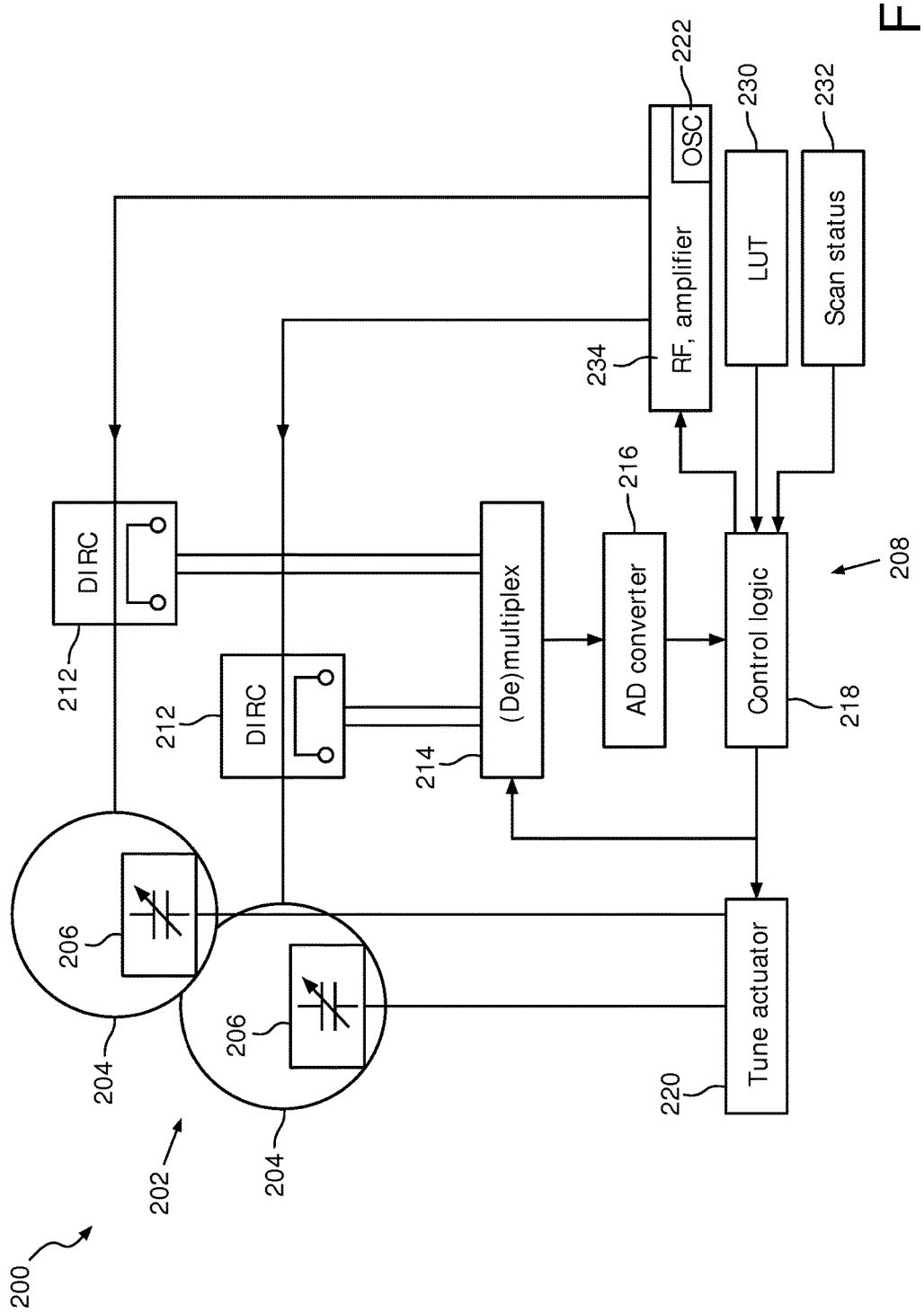
FIG. 3 is a schematic illustration of a multichannel RF receive/transmit system according to a second embodiment.

FIG. 3 schematically illustrates a multichannel RF receive/transmit system 200 according to a second embodiment. The multichannel RF receive/transmit system 200 according to the second embodiment is in mayor parts identical to the multichannel RF receive/transmit system 200 according to the first embodiment. Hence, only differences between the multichannel RF receive/transmit system 200 of the first and second embodiment are described in detail.

The RF receive/transmit system 200 of the second embodiment also comprises a tuning/matching circuit 208 similar to that of the first embodiment. Nevertheless, according to the second embodiment, the tuning/matching circuit 208 is an autonomous circuit, which is individually connected to the RF coil elements 204. Accordingly, the tuning/matching circuit 208 comprises a RF amplifier 234 for driving the RF coil array 202, which is integrally provided in this embodiment with the signal generating means 222. The RF amplifier 234 is a separate RF amplifier for the tuning/matching circuit 208, which is provided as a small amplifier. The RF oscillator 222 generates a low power RF signal with less than 0 dB at the intended resonance frequency of the RF coil element 204, which is passed directly to the RF coil elements 204. Hence, the tuning/matching circuit 208 of the RF receive/transmit system 200 of the second embodiment is provided without demultiplexer 224 and without TR switches 226. In an alternative embodiment, the RF amplifier 234 is the RF amplifier used for driving at least one RF coils element 204 of the RF coil array 202 for MR imaging. In this alternative embodiment, the RF amplifier 234 is additionally used for tuning and matching, i.e. to amplify the RF signal from the RF oscillator 222. The RF amplifier 234 can be provided integrally with the RF coil array 202. In a further alternative embodiment, the RF amplifier 234 is provided separately, integrally with the patient support, or inside the bore 116 of the main magnet 114.

Figure 4:
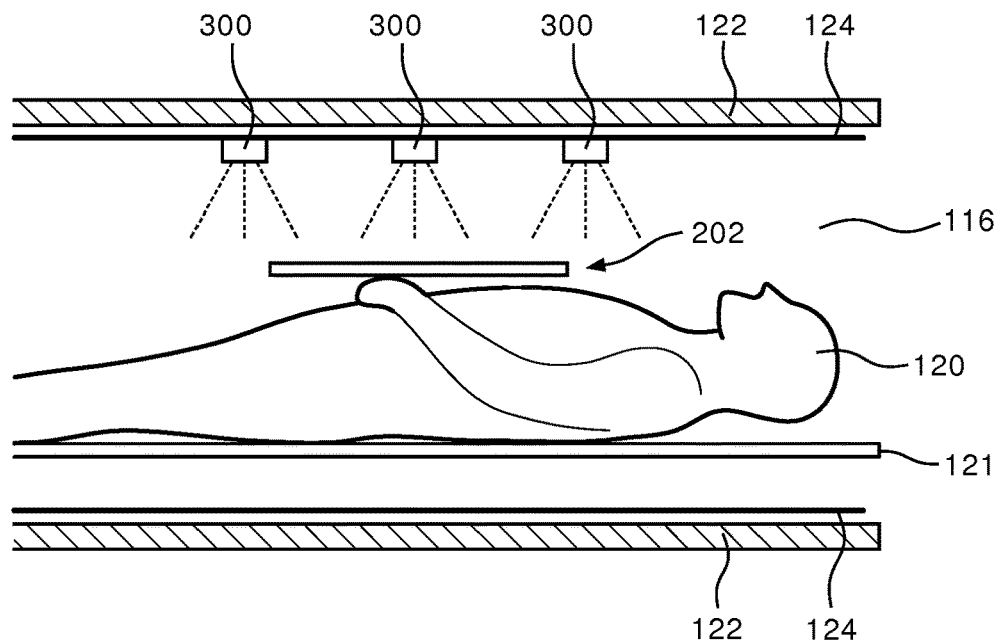
FIG. 4 is a schematic illustration of a MR imaging system according to a third embodiment as a sectional side view.
Figure 5:
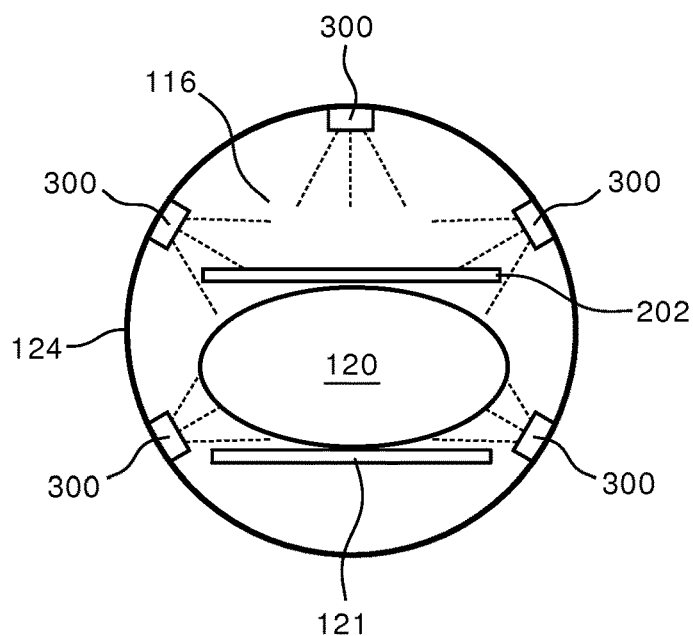
FIG. 5 is a schematic illustration of the MR imaging system of FIG. 4 in a sectional view in the longitudinal direction.

FIGS. 4 and 5 illustrates a MR imaging system 110 according to a third embodiment. The MR imaging system 110 according to the third embodiment is based on the generic embodiment shown in FIG. 1.

The RF coil array 202 is provided in this embodiment as a planar coil, which flexibly arranged on a specific region of the subject of interest 120 to be examined.

As can be seen in FIG. 4, the MR imaging system 110 comprises a set of monitoring means 300, which are provided as cameras in this embodiment. The cameras 300 are located with the examination space 116, i.e. within a bore of the main magnet 114 of the MR imaging system 110. The cameras 300 are provided in a line, as can be seen in FIG. 4, and additionally in circles, as can be seen in FIG. 5, within the examination space 116. The cameras 300 are provided for detecting a movement of the subject of interest 120 located within the bore 116 by visually monitoring the motion and to provide movement information of the subject of interest 120 to the tuning/matching circuit 208.

The cameras 300 are connected to the tuning/matching circuit 208 of the multichannel RF receive/transmit system 200 via input means 232. Required image processing to determine the motion of the subject of interest 120 based on acquired images provided by the cameras 300 is performed by the controller 218.

The movement of the load in this embodiment refers to breathing of the subject of interest 120, which implies respiratory movement of an upper part of the body of the subject of interest 120, and which is monitored using the cameras 300 by the controller 218. Hence, the breathing information is provided via the input means 232.

Figure 6:
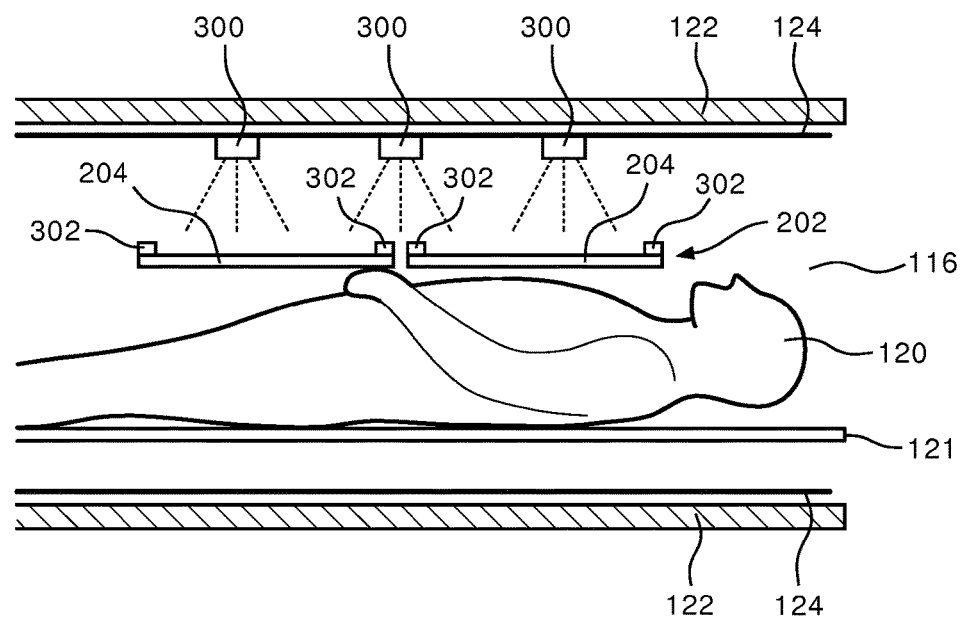
FIG. 6 is a schematic illustration of a MR imaging system according to a fourth embodiment as a sectional side view.

FIG. 6 illustrates a MR imaging system 110 according to a fourth embodiment. The MR imaging system 110 according to the fourth embodiment is based on the generic embodiment shown in FIG. 1 and the third embodiment.

According to the fourth embodiment, the multichannel RF receive/transmit system 200 comprises several markers 302 for marking a position of the multichannel RF receive/transmit system 200, which are located on the RF coil array 202. The markers 302 are provided as projections in this embodiment. When the subject of interest 120 is moved on the patient support 121 within the examination space 116 of the MR imaging system 110 during operation, so that the movement of the markers 302 is monitored to derive the movement of the subject of interest 120.

Figure 7:
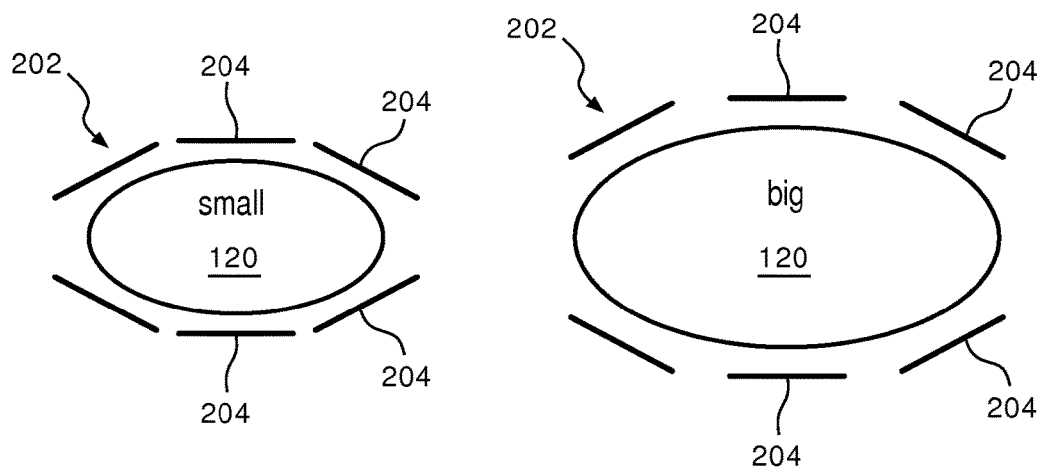
FIG. 7 is a schematic illustration of a RF coil array located at a subject of interest according to a sixth embodiment.

FIG. 7 illustrates a MR imaging system 110 according to a fifth embodiment. The MR imaging system 110 according to the fifth embodiment is based on the generic embodiment shown in FIG. 1 and the third or fourth embodiment.

According to FIG. 7, the RF coil array can be applied to different subjects of interest 120 with different physical characteristics. The MR imaging system 110 monitors these characteristics via cameras 300 and provide this information via input means 232 to the controller 218.

Next, methods for MR imaging will be described.

Figure 8:
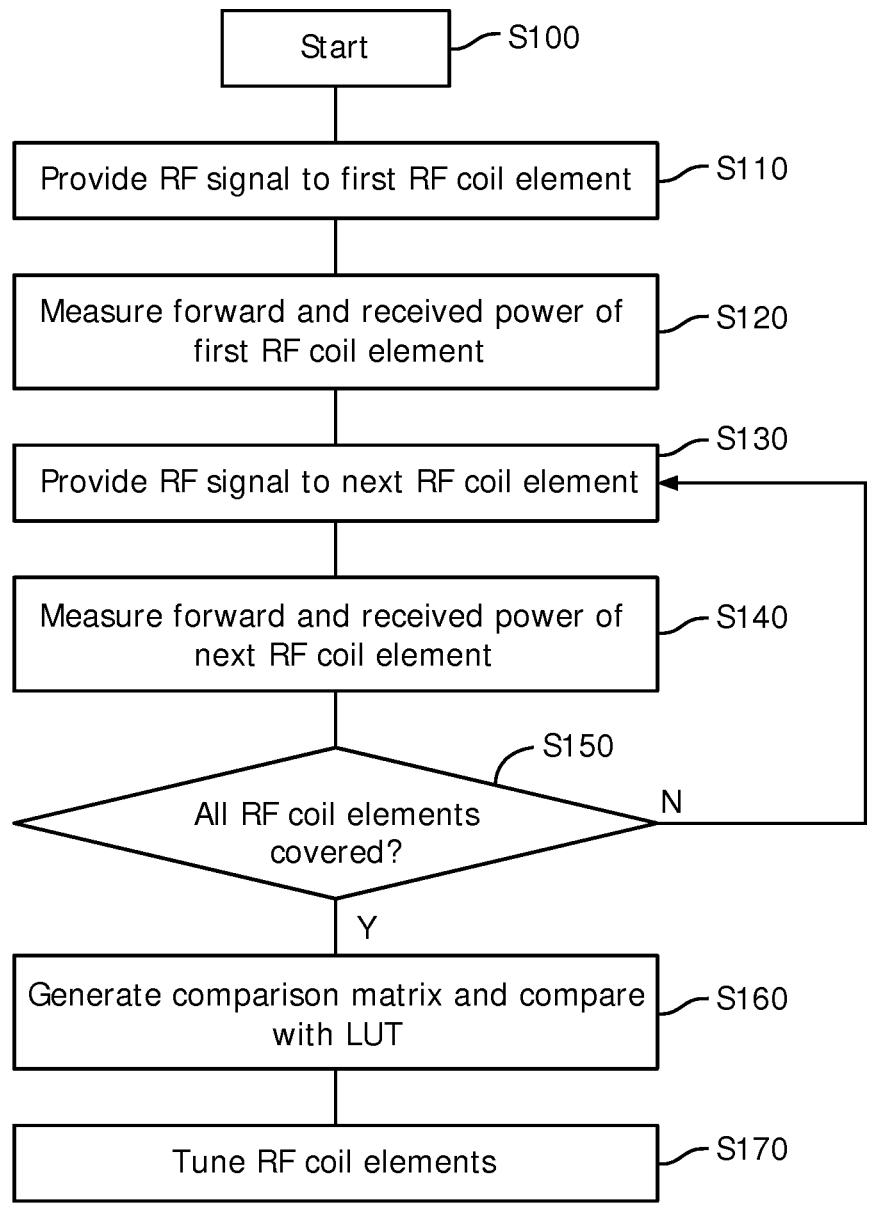
FIG. 8 is a flow chart illustrating a method for MR imaging according to a seventh embodiment.

FIG. 8 illustrates a method for MR imaging according to a seventh embodiment. The method uses any of the previously described MR imaging systems 110 employing any of the previously described multichannel RF receive/transmit systems 200.

The method of the seventh embodiment starts with step S100 prior to starting MR imaging.

In step S110, a RF signal is provided from the RF oscillator 222 to the RF coil element 204.

In step S120, the provided RF signal corresponding to the forward power is received at the directional coupler 212 and provided via multiplexer 214 and AD converter 216 to the controller 218. Subsequently, the power reflected by the RF coil element 204 is provided in the same way to the controller 218.

In step S130, a RF signal is provided from the RF oscillator 222 to a next RF coil element 204.

In step S140, the forward power and the power reflected of the next RF coil element 204 are provided to the controller 218 in accordance with step S120.

In step S150, a verification is performed if all RF coil elements 204 are covered. It not, the method continues with step S130 for the next RF coil element 204. Otherwise, the method continues with step S160.

In step S160, a comparison matrix based on the comparison results of forward and received power for the RF coil elements 204 is generated and a comparison with the look-up table 230 is performed to obtain tuning settings for the tuning means 206.

In step S170, the RF coil elements 204 are tuned based on the tuning settings from the Look-up table 230. Accordingly, the controller 218 controls the tune actuator 220 to tune the tuning means 206.

Subsequently, MR imaging is performed under application of the tuned RF coil array 202. In a modified embodiment, it is verified during MR imaging if an imaging quality is sufficient. This comprises verifying a signal to noise ratio of the acquired MR imaging data. Upon indication from the verification step, additional tuning of the RF coil array 202 is performed, if imaging quality is not sufficient.

Although method steps S100 to S170 are performed prior to starting MR imaging, the method can also be performed during the measurement to continuously monitor the load and to continuously adapt the RF coil elements 204 to current load conditions.

Figure 9:
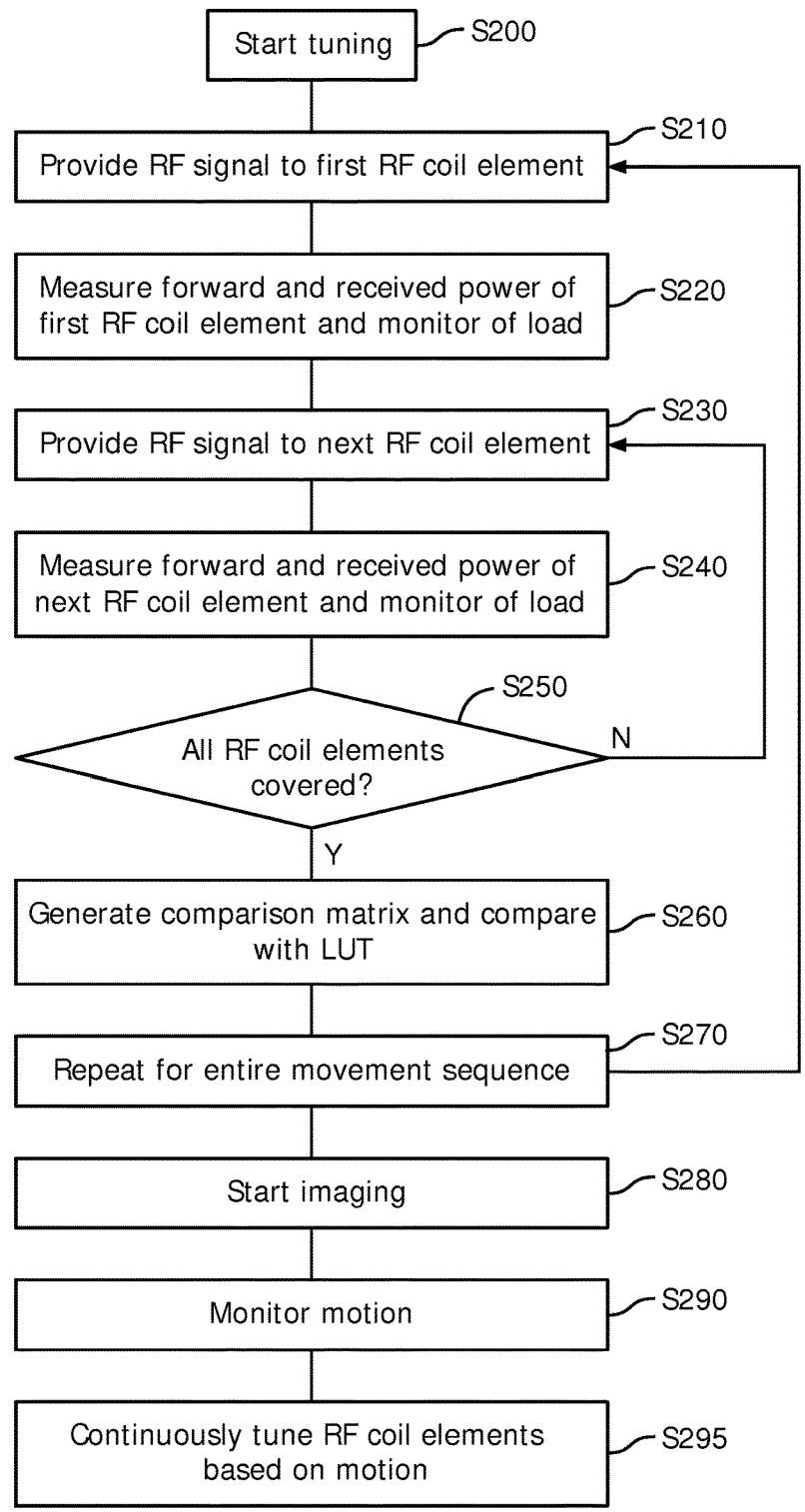
FIG. 9 is a flow chart illustrating a method for MR imaging according to a eights embodiment.

FIG. 9 illustrates a method for MR imaging according to a eighth embodiment. The method is based on the method of the seventh embodiment.

The method of the eighth embodiment starts with step S200 prior to starting MR imaging. Subsequent steps S210 to S250 are performed as described with respect to the seventh embodiment.

In step S260, a comparison matrix based on the comparison results of forward and received power for the RF coil elements 204 is generated and a comparison with the look-up table 230 is performed to obtain tuning settings for the tuning means 206. Additionally, the controller 218 receives via input means 232 motion information from the cameras 300 and evaluates a breathing status of the subject of interest 120. This information is combined with the tuning settings from the look-up table 230 according to the generated comparison matrix. Accordingly, an entry of the look-up table 230 is assigned to a current breathing status.

According to step S270, the steps S210 to S260 are repeated for an entire movement sequence, i.e. covering at least one inspiratory and one expiratory phase of the subject of interest 120. Hence, steps S200 to S270 together refer to an initial phase for evaluating tuning settings for different motion states.

In step S280, MR imaging is started.

In step S290, motion monitoring is performed continuously using the cameras 300 to determine a breathing status as discussed above.

In step S295, the RF coil elements 204 are continuously tuned based on the tuning settings from the look-up table 230 for the respective breathing status. Accordingly, the tuning settings are directly applied based on the motion information, i.e. the breathing status, without prior comparison of forward and reflected power.

Figure 10:
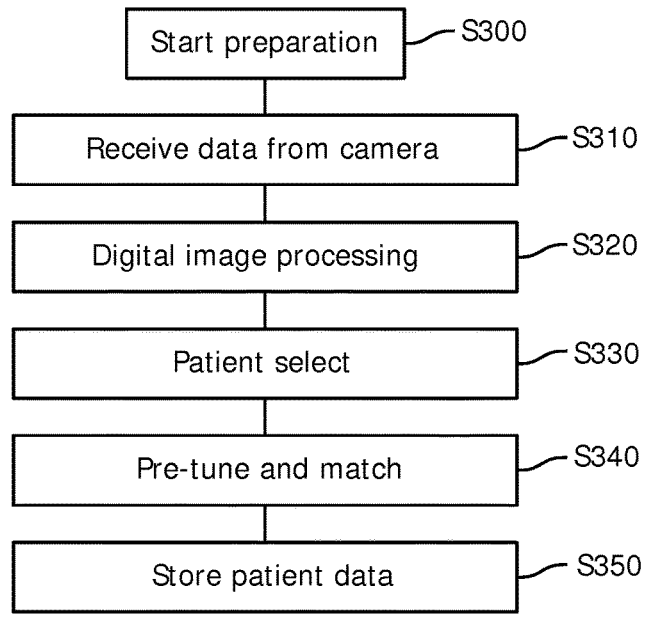
FIG. 10 is a flow chart illustrating a first part of a method for MR imaging according to a ninth embodiment.
Figure 11:
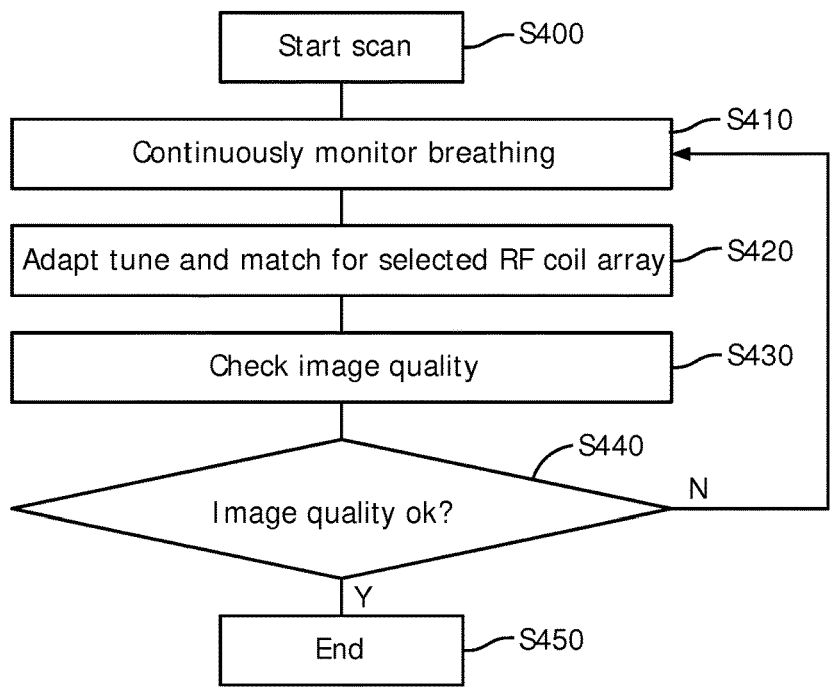
FIG. 11 is a flow chart illustrating a second part of a method for MR imaging according to the ninth embodiment.

FIGS. 10 and 11 illustrate a method for MR imaging according to a ninths embodiment. The method is based on the method of the seventh or eighth embodiment.

The method starts with step S300, where a preparation phase is started.

In step S310, data from the cameras 300 is received at the controller 218.

In step S320, the controller 218 performs digital image processing based on the data received from the cameras 300.

In step S330, a patient profile is selected. The patient profile is selected based on physical parameters, e.g. physical dimensions, of the subject of interest 120, which are determined using the cameras 300.

In step S340, a pre-tune and matching step is performed. This can comprise in one embodiment merely the method steps S100 to S170. In this embodiment, this comprises the method steps S200 to S270 covering an entire movement sequence of the subject of interest 120. Also in this embodiment, the movement refers to a breathing movement of the subject of interest 120.

In step S350, the evaluated tuning settings of the pre-tuning step is stored together with the movement information for the particular subject of interest 120.

Subsequently, in step S400, MR imaging is started. Accordingly, the information stored in step S350, i.e. the tuning settings of the pre-tuning step S340 for the particular subject of interest 120, are loaded.

In step S410, monitoring of breathing movement of the subject of interest 120 is started using the cameras 300, in accordance with step S290.

In step S420, the RF coil elements 204 are continuously tuned based on the tuning settings from the look-up table 230 for the respective breathing status, as loaded for the particular subject of interest. The tuning settings are directly applied to the tuning means 206 of the RF coil elements 204 based on the motion information, i.e. the breathing status, without prior comparison of forward and reflected power.

In step S420, it is verified during MR imaging if an imaging quality is sufficient. This comprises verifying a signal to noise ratio of the acquired MR imaging data. Upon indication from the verification step, additional tuning of the RF coil array 202 is performed, if imaging quality is not sufficient.

If the image quality is sufficient and all required imaging data is acquired, the method ends with step S450.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 110 magnetic resonance (MR) imaging system
112 magnetic resonance (MR) scanner
114 main magnet
116 RF examination space, bore
118 center axis
120 subject of interest, load
121 support
122 magnetic gradient coil system
124 RF screen
126 MR imaging system control unit
128 monitor unit
130 MR image reconstruction unit
132 control line
134 RF transmitter unit
136 RF switching unit
138 control line
140 radio frequency (RF) antenna device
200 multichannel radio frequency (RF) receive/transmit system
202 RF coil array
204 RF coil element
206 tuning means
208 tuning/matching circuit
210 cable
212 directional coupler, DIRC
214 multiplexing means, multiplexer
216 AD converter
218 controller, control logic
220 tune actuator
222 RF oscillator, RF signal generating means
224 de-multiplexing means
226 transmit/receive-switch
230 look-up table (LUT)
232 scan status input, input means
234 RF amplifier
300 monitoring means, camera
302 marker

The invention claimed is:

1. A multichannel radio frequency (RF) receive/transmit system for use in an magnetic resonance (MR) imaging system which includes a main magnet configured to generate a static magnetic field in an examination space, a gradient coil system configured to superimpose magnetic field gradients on the static magnetic field and an RF transmitter configured to feed RF power to the multichannel RF receive/transmit system to implement an imaging sequence, the multichannel RF receive/transmit system comprising:
   a plurality of RF coil elements configured for emission and reception of RF signals, each RF coil element including an adjustable impedance for tuning a resonance frequency of the RF coil element, the plurality of RF coil elements defining a plurality of channels;
   each of the channels including an RF oscillator, the RF oscillator being configured to provide an RF signal to the RF coil elements of the channel;
   each of the channels further including a tuning/matching circuit configured to compare forward power provided to at least one of the RF coil elements by the RF oscillator with reflected power at the respective RF coil element of the at least one of the RF coil elements, and to adjust the variable impedance of the at least one of the RF coil elements based on the comparison of the forward power and the reflected power to tune the least one of the RF coil elements.

2. The multichannel RF receive/transmit system according to any of claim 1, wherein
   the tuning/matching circuit comprises multiplexing means, which are connected to the RF coil elements for multiplexing the forward and reflected power of multiple RF coil elements.

3. The multichannel RF receive/transmit system according to claim 1, wherein
   the plurality of RF coil elements, the tuning/matching circuit, and the RF oscillator are integral and configured to be inserted into and removed from the examination space of an associated MR imaging system as an integral structure.

4. The multichannel RF receive/transmit system according to claim 1, wherein
   the tuning/matching circuit comprises a look-up table with tuning settings depending on a load.

5. The multichannel RF receive/transmit system according to claim 4, wherein
   the tuning/matching circuit comprises input means for receiving input in respect to the load.

6. The multichannel RF receive/transmit system according to claim 1, comprising
   at least one marker for marking a position of the multichannel RF receive/transmit system, in the examination space of an associated MR imaging system.

7. A magnetic resonance (MR) imaging system comprising:
   a main magnet configured to generate a static magnetic field (MR) in an examination space;
   a system radio frequency (RF) transmitter configured to feed a higher power RF signal to an RF antenna;
   gradient coils configured to superimpose magnetic field gradients on the static magnetic field in the examination region;
   a controller configured to control the RF transmitter to transmit the RF power RF signals and the gradient coils to superimpose magnetic field gradients in accordance with an imaging sequence and configured to reconstruct MR signals received by the antenna into images;
   wherein the antenna comprises a multichannel RF receive/transmit system including:
      an RF coil array with multiple RF coil elements configured for emission and reception of RF signals, the RF coil elements defining a plurality of channels,
      a plurality of RF oscillators configured for providing a lower power RF signal of less than 0 db, each of the RF oscillators providing the lower power RF signal to one of the channels, and
      tuning/matching circuits associated with the RF coil elements and configured for comparing forward power of the lower power RF signal provided to at least one of the RF coil elements by one of the RF oscillators with reflected power at the respective RF coil element of the at least one of the RF coil elements, and for tuning the at least one of the RF coil elements based on a comparison of the forward power and the reflected power of at least one of the RF coil elements.

8. The MR imaging system according to claim 7, comprising:
   monitoring means for detecting a movement of a load located within the examination space of the MR imaging system, the monitoring means being connected to the tuning/matching circuit of the multichannel RF receive/transmit system to provide movement information of the load to the tuning/matching circuit.

9. The MR imaging system according to claim 8, wherein the monitoring means for detecting a movement of the load is located within the examination space of the MR imaging system and includes at least one camera.

10. A method for performing magnetic resonance (MR) imaging using the MR imaging system according to claim 7, comprising the steps of:
    tuning the RF coil array by providing forward power to at least one RF coil element of the RF coil array with the RF oscillator, comparing the forward power and the reflected power at the respective RF coil element of the at least one of the RF coil elements, and tuning the at least one of the RF coil elements based on a comparison of the forward power and the reflected power at least one of the RF coil elements,
    exciting magnetic resonance using the MR transmitter,
    performing MR image data acquisition,
    verifying if imaging quality is sufficient, and
    performing repeated tuning using the MR oscillator if imaging quality is not sufficient.

11. A method for performing magnetic resonance (MR) imaging using the MR imaging system according to claim 8, comprising the steps of:
    performing a pre-tuning step for evaluating tuning settings for the RF coil array based on different positions of the load within the examination space of the MR imaging system and based on a comparison of the forward power and the reflected power of at least one of the RF coil elements of the RF coil array,
    starting a MR imaging sequence,
    monitoring movement of the load within the bore of the MR imaging system, and
    continuously performing tuning of the RF coil array under consideration of the movement of the load within the bore as monitored.

12. The method for performing MR imaging according to claim 11, comprising the steps of:
    storing the evaluated tuning settings of the pre-tuning step with reference to a particular load, and loading the stored tuning settings of the pre-tuning step with reference to the load particular prior to starting a MR imaging sequence.

13. The method for performing magnetic resonance (MR) imaging according to claim 11, comprising the steps of:
evaluating the size of the load, and
performing the tuning of the RF coil array under consideration of the size of the load.

14. The multichannel RF receive/transmit system according to claim 1, wherein the RF oscillators are different from the RF transmitter of the MR imaging system.

15. The multichannel RF receive/transmit system according to claim 1, wherein the RF signal output by the RF oscillator and any associated amplifier has a power less than 0 db.

16. The MR imaging system according to claim 7, wherein the multichannel RF receive/transmit system comprises a local coil configured for insertion into an removal from the examination space.

17. The MR imaging system according to claim 7, wherein the RF oscillator is different from the RF transmitter.

18. The method for performing the MR imaging according to claim 10, further including:
performing the repeated tuning concurrently with performing the MR imaging data acquisition.

\* \* \* \* \*